(12) United States Patent
Vukkadala et al.

(10) Patent No.: US 9,430,593 B2
(45) Date of Patent: Aug. 30, 2016

(54) SYSTEM AND METHOD TO EMULATE FINITE ELEMENT MODEL BASED PREDICTION OF IN-PLANE DISTORTIONS DUE TO SEMICONDUCTOR WAFER CHUCKING

(71) Applicant: KLA-Tencor Corporation, Milpitas, CA (US)

(72) Inventors: Pradeep Vukkadala, Fremont, CA (US); Sathish Veeraraghavan, Santa Clara, CA (US); Jaydeep Sinha, Livermore, CA (US); Haiguang Chen, Mountain View, CA (US); Michael Kirk, Los Altos Hills, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 594 days.

(21) Appl. No.: 13/735,737

(22) Filed: Jan. 7, 2013

(65) Prior Publication Data

US 2014/0107998 A1    Apr. 17, 2014

Related U.S. Application Data

(60) Provisional application No. 61/712,259, filed on Oct. 11, 2012, provisional application No. 61/712,746, filed on Oct. 11, 2012.

(51) Int. Cl.
| | |
|---|---|
| *G06F 17/10* | (2006.01) |
| *G06F 17/50* | (2006.01) |
| *H01L 21/67* | (2006.01) |

(52) U.S. Cl.
CPC ..... *G06F 17/5018* (2013.01); *H01L 21/67288* (2013.01)

(58) Field of Classification Search
CPC .................................................. H01L 21/67288
USPC ............................................................ 703/2
See application file for complete search history.

(56) References Cited

U.S. PATENT DOCUMENTS

| | | | |
|---|---|---|---|
| 6,892,365 B2 | 5/2005 | Culp et al. | |
| 7,184,853 B2 | 2/2007 | Roberts et al. | |

(Continued)

FOREIGN PATENT DOCUMENTS

| | | |
|---|---|---|
| WO | WO2006093722 | 9/2006 |
| WO | 2007-117737 A2 | 10/2007 |

OTHER PUBLICATIONS

Turner, et al.: "Predicting distortions and overlay errors due to wafer deformation during chucking on lithography scanners" Journal of Micro/Nanolith. MEMS MOEMS, vol. 8, 2009; pp. 1-8.*

(Continued)

*Primary Examiner* — Hugh Jones
(74) *Attorney, Agent, or Firm* — Suiter Swantz pc llo

(57) ABSTRACT

Systems and methods for prediction of in-plane distortions (IPD) due to wafer shape in semiconductor wafer chucking process is disclosed. A process to emulate the non-linear finite element (FE) contact mechanics model based IPD prediction is utilized in accordance with one embodiment of the present disclosure. The emulated FE model based prediction process is substantially more efficient and provides accuracy comparable to the FE model based IPD prediction that utilizes full-scale 3-D wafer and chuck geometry information and requires computation intensive simulations. Furthermore, an enhanced HOS IPD/OPD prediction process based on a series of Zernike basis wafer shape images is also disclosed.

36 Claims, 11 Drawing Sheets

(56) References Cited

U.S. PATENT DOCUMENTS

| | | |
|---|---|---|
| 7,645,546 B2 | 1/2010 | Yang et al. |
| 8,289,515 B2 | 10/2012 | Brill et al. |
| 2006/0273266 A1 | 12/2006 | Preil et al. |
| 2008/0316504 A1 | 12/2008 | Nemets et al. |
| 2011/0172982 A1 | 7/2011 | Veeraraghavan |
| 2012/0208301 A1 | 8/2012 | Izikson et al. |
| 2013/0089935 A1 | 4/2013 | Vukkadala et al. |

OTHER PUBLICATIONS

Nagaswami et al.: DPL Overlay Components; 6th International Symposium on Immersion Lithography Extensions; Prague, Oct. 18-23, 2009; pp. 1-27.*

Choi et al.: Optimization of High Order Control including overlay, alignment & sampling; Metrology, Inspection, and Process Control for Microlithography XXII, Proc. of SPIE vol. 6922, 69220P, (2008); pp. 1-10.*

Choi et al. The study and simulation of high-order overlay control including fieldby-field methodology; Metrology, Inspection, and Process Control for Microlithography XXIII; Proc. of SPIE vol. 7272; 2009; pp. 1-10.*

Veeraraghaven et al.: "Simulation of non-uniform wafer geometry & thin film residual stress on overlay errors", Proc. SPIE 7971, Metrology Inspection, & Process Control for Microlithography XXV, (Apr. 20, 2011); pp. 1-6.*

\* cited by examiner

SYSTEM AND METHOD TO EMULATE FINITE ELEMENT MODEL BASED PREDICTION OF IN-PLANE DISTORTIONS DUE TO SEMICONDUCTOR WAFER CHUCKING

CROSS-REFERENCE TO RELATED APPLICATIONS

The present application claims the benefit under 35 U.S.C. §119(e) of U.S. Provisional Application Ser. No. 61/712,259, filed Oct. 11, 2012. Said U.S. Provisional Application Ser. No. 61/712,259 is hereby incorporated by reference in its entirety.

The present application also claims the benefit under 35 U.S.C. §119(e) of U.S. Provisional Application Ser. No. 61/712,746, filed Oct. 11, 2012. Said U.S. Provisional Application Ser. No. 61/712,746 is hereby incorporated by reference in its entirety.

TECHNICAL FIELD

The disclosure generally relates to the field of wafer surface metrology, and particularly to a system and a method for the prediction of in-plane distortions (IPD) introduced by the wafer shape in semiconductor wafer chucking process.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Generally, certain requirements are established for the flatness and thickness uniformity of the wafers. However, chucking of substrates with wafer shape (defined as the median surface of the wafer in its free state obtained from the front and back surfaces of the wafer) and thickness variations results in elastic deformation that can cause significant in-plane distortions (IPD). IPD may lead to errors in downstream applications such as overlay errors in lithographic patterning or the like. Therefore, providing the ability to predict/estimate IPD due to wafer shape in the chucking process and thus to control the wafer shape specification is a vital part of semiconductor manufacturing process.

The development and usage of a finite element (FE) model based IPD prediction is described in: Predicting distortions and overlay errors due to wafer deformation during chucking on lithography scanners, Kevin Turner et al., Journal of Micro/Nanolithography, MEMS, and MOEMS, 8(4), 043015 (October-December 2009), which is herein incorporated by reference in its entirety. The FE model based IPD prediction utilizes full-scale 3-D wafer and chuck geometry information and simulates the non-linear contact mechanics of the wafer chucking mechanism, allowing the FE model to provide the most accurate prediction of IPD of the wafer surface. The FE model is developed and executed through a simulation-driven product development tool such as the ANSYS software package from ANSYS, Inc. However, FE model based IPD prediction is computationally expensive and may be complicated to setup, and therefore it is not suitable to be used in a high volume manufacturing environment.

Wafer higher order shape (HOS) information extracted from using wafer geometry tools, such as WaferSight from KLA-Tencor, can also be utilized to provide IPD prediction. For instance, wafer shape and HOS information may be used to simulate wafer chucking and predict its IPD. However, studies have shown that while HOS based IPD prediction may provide acceptable results for medium warp wafers, the accuracy of the IPD prediction degrades as the degree of wafer warp increases. The accuracy of HOS-based IPD prediction degrades primarily due to the fact that large $2^{nd}$ order shape of the wafer (e.g., bowl, dome, saddle and the like) contributes to IPD during wafer chucking that is not completely represented by just the local higher order wafer slope. HOS, which is a local higher order slope based metric, is unable to capture well the IPD coma components (i.e., IPD distribution contours which closely resemble contours of coma components of Zernike polynomials) produced by large $2^{nd}$ order shape and other lower order high magnitude shape components.

Therein lies a need for systems and methods for accurate and efficient prediction of in-plane distortions due to semiconductor wafer shape in the chucking process without the aforementioned shortcomings.

SUMMARY

The present disclosure is directed to a computer implemented method for providing in-plane distortion (IPD) prediction for a given wafer and a specified chucking process. The method includes: generating a plurality of sample wafer shapes, each of the plurality of sample wafer shapes generated by varying a set of coefficients B in a predefined shape equation; performing finite element (FE) model based IPD prediction for each one of the plurality of sample wafer shapes, wherein for each one of the plurality of sample wafer shapes an IPD prediction with respect to x-axis (X-IPD) and an IPD prediction with respect to y-axis (Y-IPD) are obtained; for each particular sample wafer shape of the plurality of sample wafer shapes, fitting a pair of polynomial equations to the FE model based X-IPD prediction and the FE model based Y-IPD prediction to obtain a set of coefficients A that corresponds to the set of coefficients B used to generate said particular sample wafer shape; analyzing the set of coefficients B and the set of coefficients A to determine a mapping function f suitable for calculating coefficients A given the values of coefficients B; utilizing the mapping function f to calculate an interim shape for the initial shape of the given wafer; and predicting the X-IPD and Y-IPD for the given wafer based on the interim shape.

The method described above may be utilized for overlay error prediction. The method may further include: obtaining a second shape of the given wafer after a wafer patterning process; utilizing the mapping function f to calculate an second interim shape for the second shape of the given wafer; predicting the IPD for the given wafer after the wafer patterning process based on the second interim shape; calculating differences between the IPD for the given wafer predicted before the wafer patterning process and the IPD for the given wafer predicted after the wafer patterning process; and applying a linear scanner correction routine to the IPD differences to obtain the overlay error prediction.

A further embodiment of the present disclosure is also directed to a computer implemented method for providing IPD prediction for a given wafer and a particular type of chucking process. The method includes: generating a series of Zernike basis wafer shapes; performing finite element (FE) model based IPD prediction for each one of the series of Zernike basis wafer shapes; performing higher order shape (HOS) based IPD prediction for each one of the series of Zernike basis wafer shapes; for each particular Zernike basis wafer shape of the series of Zernike basis wafer shapes, comparing its FE model based IPD prediction and its HOS based IPD prediction to determine whether said particular Zernike basis wafer shape produces large prediction differences between the FE model based IPD prediction and the HOS based IPD prediction; storing the Zernike basis wafer shapes that produce large prediction differences between the FE model based IPD prediction and the HOS based IPD prediction; and utilizing the stored Zernike basis wafer shapes to improve accuracy of a HOS based IPD prediction result for the given wafer and the particular type of chucking process.

The method described above may also be utilized for overlay error prediction. The method may further include: performing a second HOS based IPD prediction for the given wafer after a wafer patterning process; utilizing the stored Zernike basis wafer shapes to improve accuracy of the second HOS based IPD prediction result; calculating differences between the IPD for the given wafer predicted before the wafer patterning process and the IPD for the given wafer predicted after the wafer patterning process; and applying a linear scanner correction routine to the IPD differences to obtain the overlay error prediction.

Furthermore, the methods described above may be integrated into a system for providing IPD prediction for a given wafer. The system may include an optical system and an IPD prediction module in communication with the optical system. The optical system may be configured to obtain the wafer shape of the given wafer, and the IPD prediction module may be configured to carry out at least one of the methods described above.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

The present disclosure is directed to systems and methods for prediction of in-plane distortions (IPD) due to wafer shape in semiconductor wafer chucking process. A process or a combination of analytical and empirical method to emulate the non-linear finite element (FE) contact mechanics model based IPD prediction is utilized in accordance with one embodiment of the present disclosure. The emulated FE model based prediction process (may be referred to as the EFE process) is substantially more efficient and provides accuracy comparable to the FE model based IPD prediction that utilizes full-scale 3-D wafer and chuck geometry information and requires computation intensive simulations.

The purpose of using the EFE process in accordance with the present disclosure is to generate IPD signatures that are similar to the IPD coma components that would be observed in FE predictions. More specifically, suppose for each initial shape, there exists a certain shape, referred to as the interim shape, whose local slopes (x- and y-slopes) cause the IPD signatures to change similar to the IPD coma components that would be observed in FE predictions. Under this postulate, for any given initial shape, once its corresponding interim shape is determined, its IPD coma components can be captured as well, allowing the EFE process to provide relatively accurate emulation of FE IPD predictions for that given initial shape.

Figure 1:
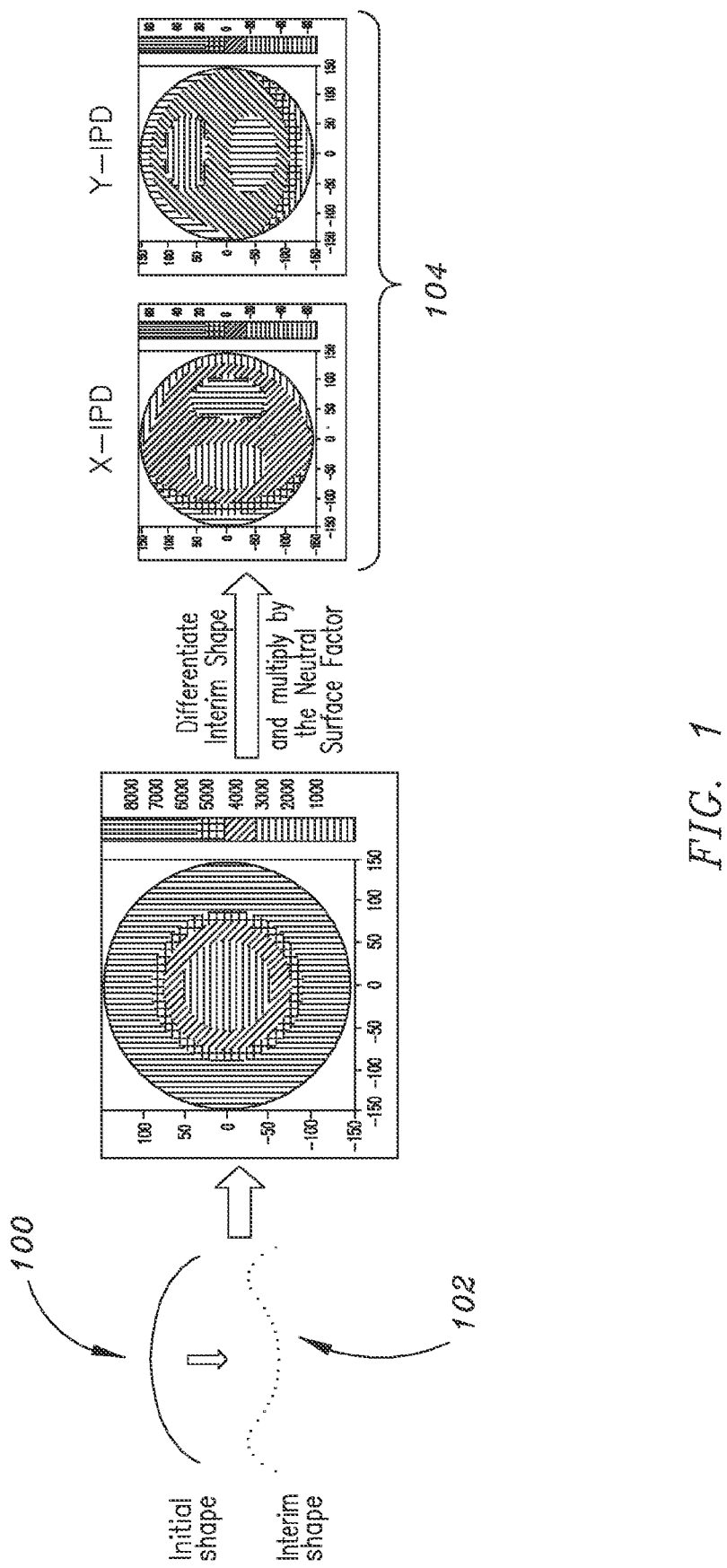
FIG. 1 is an illustration depicting the relationship between an initial shape and its corresponding interim shape.

FIG. 1 is an illustration depicting the relationship between an initial shape 100 and its corresponding interim shape 102. The initial shape 100 represents measured shape data of a physical wafer. The interim shape 102, on the other hand, is a mathematical model that can be integrated with the initial shape data to produce IPD predictions 104. It is contemplated that the IPD predictions 104 may include predictions for both x and y axis.

Figure 2:
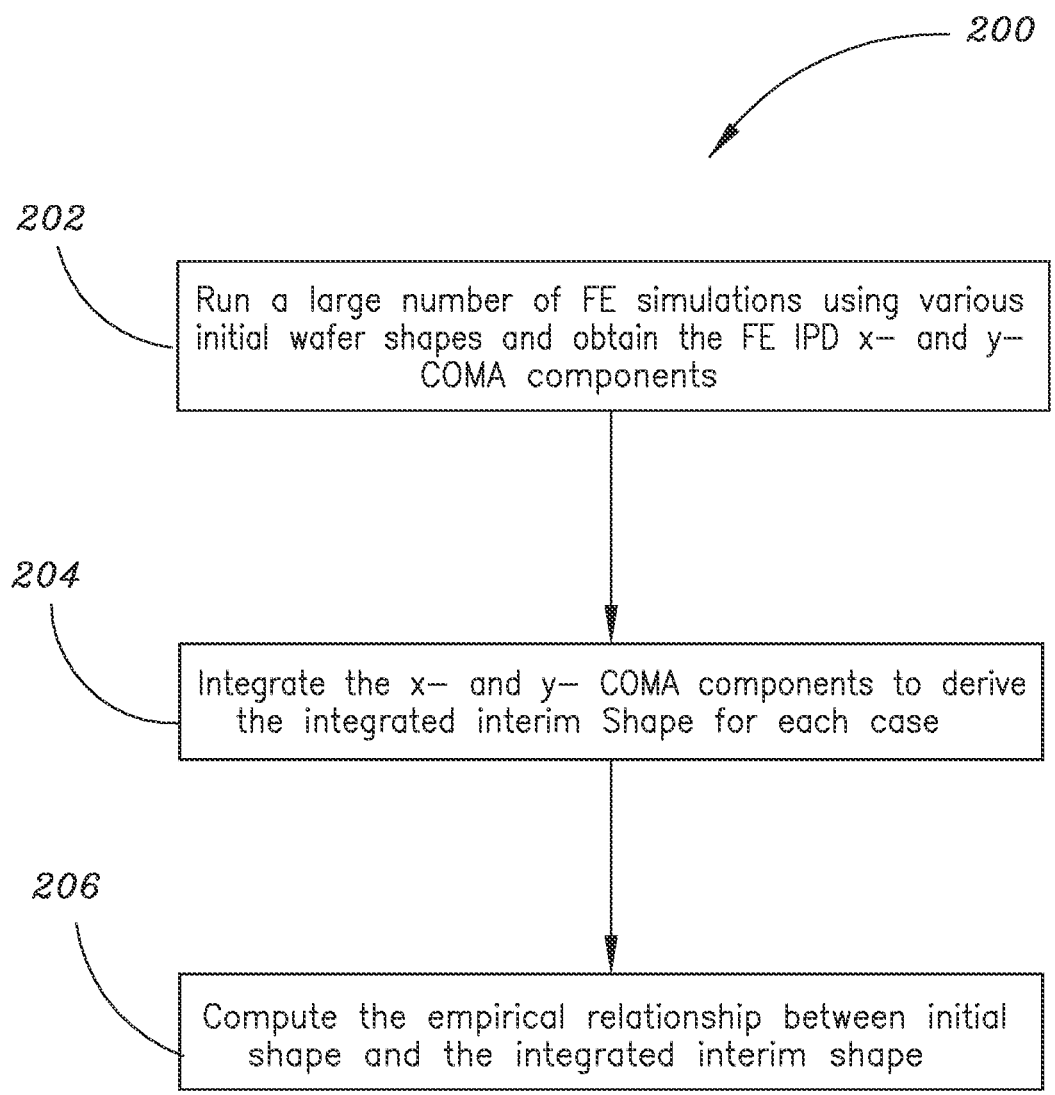
FIG. 2 is a flow diagram illustrating a method for determining the interim shape for a given initial wafer shape.

Now the question is how to determine the interim shape for a given initial wafer shape. FIG. 2 shows a method 200 for determining the interim shape for a given initial wafer shape by solving the inverse problem utilizing FE simulation results. In step 202, a large number of FE model based IPD predictions for various initial wafer shapes are processed and the prediction results (e.g., x- and y-coma components and the like) are obtained. Step 204 then integrates the FE model based prediction results to derive the interim shape for each initial wafer shape, and step 206 may subsequently determine the relationship between the initial wafer shape and the interim shape based on data collected from steps 202 and 204. The relationship between the initial wafer shape and the interim shape determined in step 206 provides a model for determining the interim shape for any given initial wafer shape.

In one embodiment, step 202 is processed for a large number of initial sample wafer shapes created from $2^{nd}$ order polynomial equations. For example, a polynomial equation such as $Z_0(x,y)=b_1+b_2x^2+b_3xy+b_4y^2$ may be utilized for creating various sample wafer shapes. More specifically, by varying the coefficients $b_1$ through $b_4$, a variety of input shapes can be created, including bow up, bow down, saddle shapes and the like.

Figure 3:
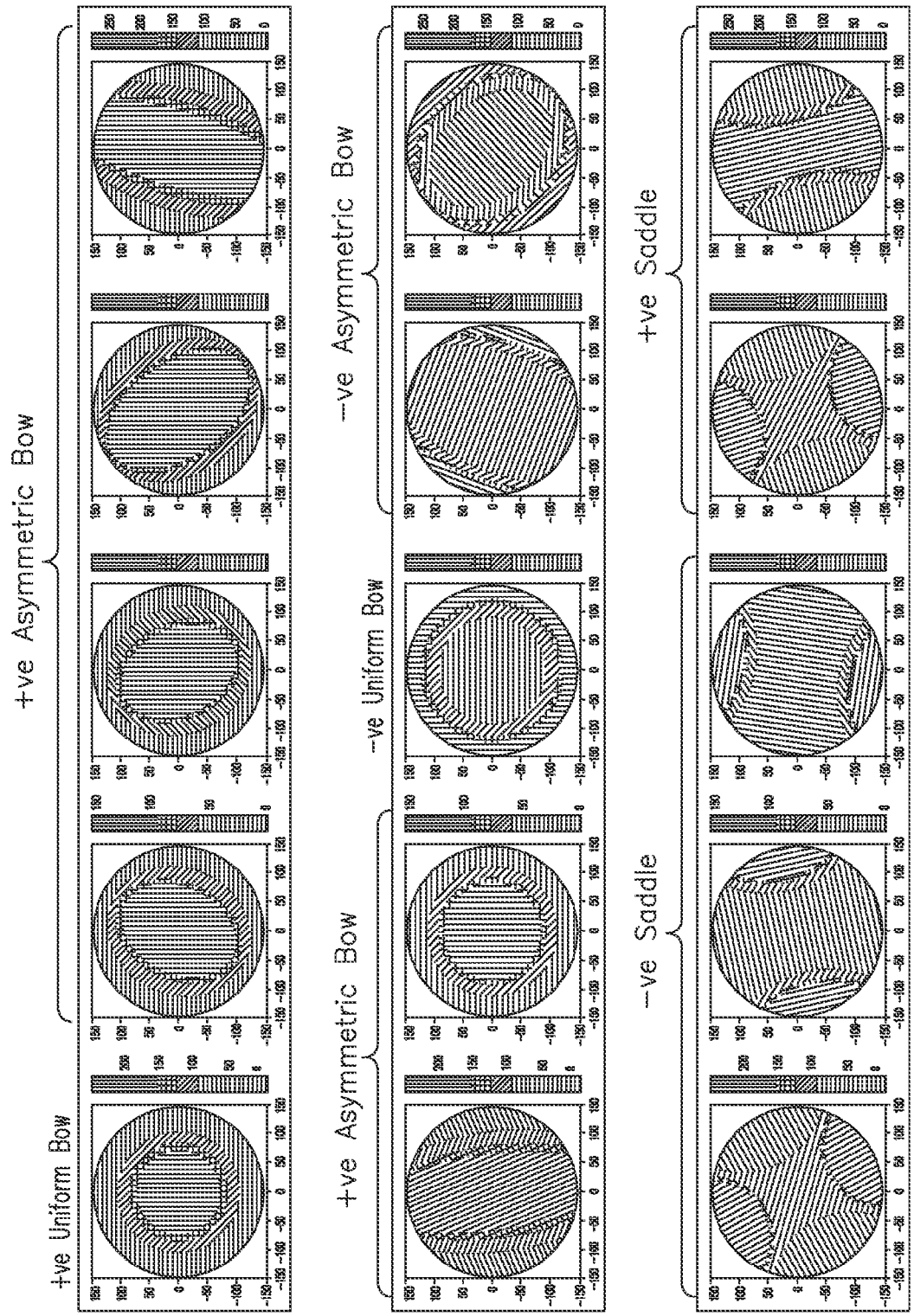
FIG. 3 is an illustration depicting a set of sample wafer shapes generated using a polynomial equation.

FIG. 3 illustrates a subset of the input shapes generated using the polynomial equation described above. The input shapes range from uniform and asymmetric positive bow (bow up), uniform and asymmetric negative bow (bow down), as well as positive and negative saddle shapes. It is understood that the subset of the input shapes shown in FIG. 3 are merely exemplary, and that additional input shapes may be generated without departing from the spirit and scope of the present disclosure.

Figure 4:
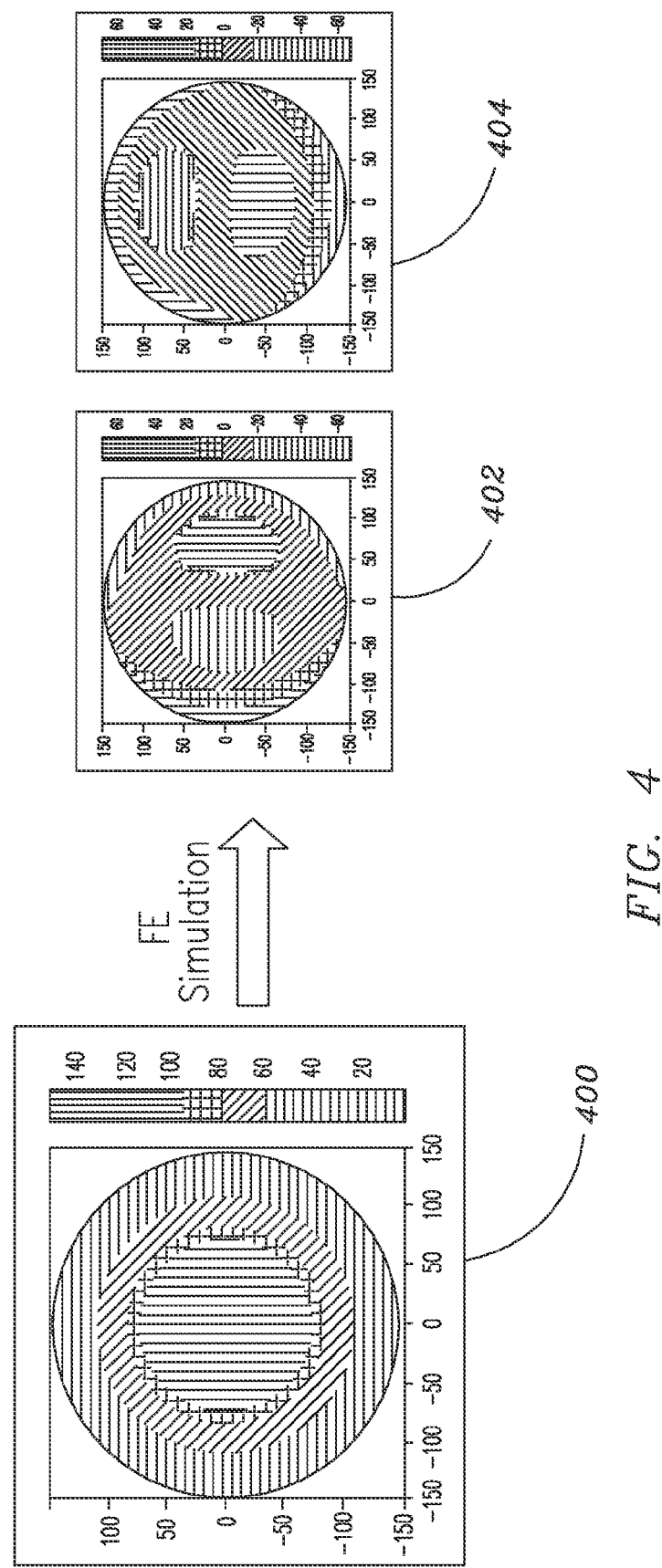
FIG. 4 is an illustration depicting an initial shape and its corresponding IPD predictions using FE simulation with respect to both x-axis and y-axis.

As described above, the FE model based IPD prediction process is performed for each of the initial wafer shape created. For instance, as shown in FIG. 4, the FE model based IPD prediction performed for a sample initial shape 400 may provide IPD predictions with respect to both x-axis (may be referred to as X-IPD 402) and y-axis (may be referred to as Y-IPD 404).

Step 204 then integrates the FE model based prediction results to derive the interim shape for each initial wafer shape. In one embodiment, a pair of polynomial equations is utilized to describe the X-IPD 402 divided by a neutral surface factor and the Y-IPD 404 divided by the neutral surface factor. The development and usage of shape-slope residual metric is described in: Overlay and Semiconductor Process Control Using a Wafer Geometry Metric, P. Vukkadala et al., U.S. patent application Ser. No. 13/476,328, which is herein incorporated by reference in its entirety. More specifically, the X-IPD 402 may be expressed as:

$$\frac{\partial z}{\partial x} = a_1 2x + a_2 y + a_4 4x^3 + a_5 3x^2 y + a_6 2xy^2 + a_7 y^3 \ldots$$

the Y-IPD 404 may be expressed as:

$$\frac{\partial z}{\partial y} = a_2 x + a_3 2y + a_5 x^3 + a_6 2x^2 y + a_7 3xy^2 + a_8 4y^3 \ldots$$

and the polynomial equations for $$\frac{\partial z}{\partial x} \text{ and } \frac{\partial z}{\partial y}$$

may now be fitted to their corresponding shapes 402 and 404, respectively, to obtain the coefficients $a_1$ through $a_n$. The polynomial equations for $$\frac{\partial z}{\partial x} \text{ and } \frac{\partial z}{\partial y}$$

chosen here are obtained by taking the partial derivative of the equation for Z(x,y) (shown in the next page) relative to variables x and y. This method allows for efficiently integrating the X-IPD and Y-IPD to obtain the interim shape Z. However, note that other available methods for integrating two independent derivatives into an integral may also be used to achieve the same result.

It is noted that the Taylor polynomials described above are open-ended to indicate that polynomials of higher order may be utilized without departing from the spirit and scope of the present disclosure. Using higher order polynomials will reduce the shape fitting error. However, note that the higher order model requires more computation of the fitting coefficients and may degrade the model prediction in the general shape variation. It is also contemplated that specific polynomial equations used to express the shapes are not limited to the Taylor polynomials described above. For instance, polynomial fitting using Zernike polynomials may also be utilized without departing from the spirit and scope of the present disclosure. Furthermore, it is understood that any surface mapping/fitting techniques may be employed to facilitate the fitting process to determine the coefficients $a_1$ through $a_n$.

Now, for simplicity of the discussion, suppose Taylor polynomials are utilized, and upon completion of the fitting process, coefficients $a_1$ through $a_8$ have been determined. Such coefficients can then be used to derive the interim shape Z for each initial wafer shape $Z_0$. More specific to the example described above, for each initial shape defined as $$Z_0(x,y)=b_1+b_2x^2+b_3xy+b_4y^2,$$

its corresponding interim shape Z may be defined as $$Z(x,y)=a_1x^2+a_2xy+a_3y^2+a_4x^4+a_5x^3y+a_6x^2y^2+a_7xy^3+a_8y^4.$$

It is contemplated that the process described above for obtaining the interim shape for a given initial shape may be repeated (or executed in parallel) for each of the large number of sample wafer shapes created in step 202. That is, for each initial shape defined by a set of coefficients $b_1$ through $b_4$ (jointly referred to as B), a set of corresponding coefficients $a_1$ through $a_8$ (jointly referred to as A) can be determined. Suppose that the relationship between the set of coefficients B and the set of coefficients A can be defined as a function $f$, then if $f$ is obtained, coefficients A can be computed directly for a given set of B.

Step 206 therefore tries to obtain the function $f$ based on the data collected from steps 202 and 204. That is, each set of B used to generate a sample wafer shape in step 202 and its corresponding set of A obtained in step 204 are used as training data in step 206 in order to obtain the function $f$.

In one embodiment, the function $f$ is defined as A=$f$(B)× C, wherein C is also a set of coefficients. More specifically, $a_i$ may be defined as:

$$a_i=c_1b_3+c_2b_2^2+c_3b_3^2+c_4b_4^2+c_5b_2b_4+c_6b_2b_3+c_7b_4b_3+\\c_8b_2^3+c_9b_4^3+c_{10}b_2^2b_3+c_{11}b_2^2b_4+c_{12}b_3^2b_2+\\c_{13}b_3^2b_4+c_{14}b_4^2b_3+c_{15}b_4^2b_2$$

It is contemplated that more terms may be used in the polynomial above to make adjustments to the model if needed to improve model accuracy. However, for simplicity of the discussion, 15 coefficients, i.e., $c_1$ through $c_{15}$, are used for each $a_i \in A$. This results in a total of 15×8=120 coefficients to be determined in order to establish the relationship between B and A. Since the values of $\forall b_i \in B$ and $\forall a_i \in A$ are known in this training process, the 120 coefficients can be obtained by solving the equations using any equation solving techniques.

With the values of C determined, they can be used to compute the values of A directly for any given set of B. For example, upon receiving shape data of a new wafer, the values of $b_1$ through $b_4$ that describe the new wafer shape $Z_0$ may be determined by fitting the equation $Z_0(x,y)=b_1+b_2x^2+b_3xy+b_4y^2$ to the new wafer shape. Subsequently, the values of A can be calculated based on the values of B obtained using surface fitting and the values of C determined using the prediction process 200 described above. With the values of A determined, the interim shape $Z(x,y)=a_1x^2+a_2xy+a_3y^2+a_4x^4+a_5x^3y+a_6x^2y^2+a_7xy^3+a_8y^4$ that corresponds to the new wafer shape $Z_0$ can also be determined. Furthermore, by definition of the interim shape Z, its x-slope $\partial z/\partial x$ can be calculated to predict the X-IPD for $Z_0$. Similarly, the y-slope of the interim shape, $$\frac{\partial z}{\partial y},$$

can be calculated to predict the Y-IPD for $Z_0$.

Figure 5:
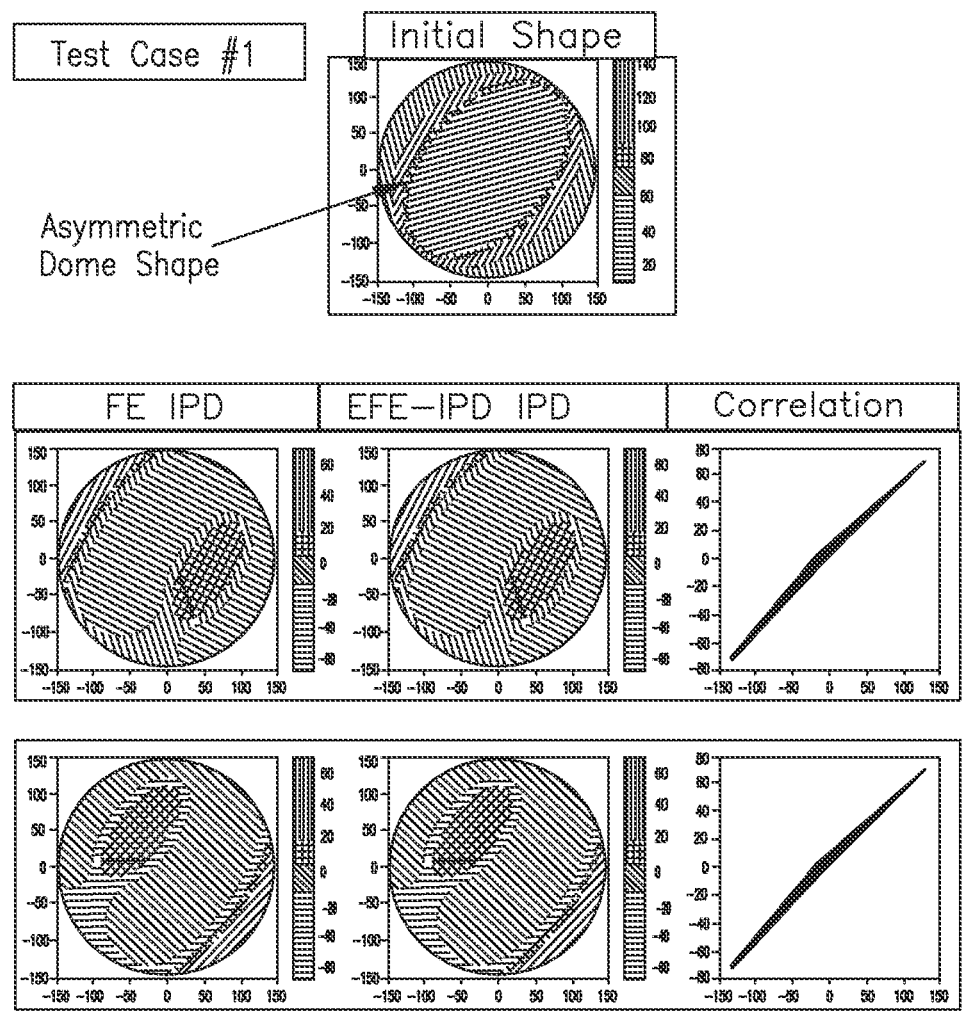
FIG. 5 is an illustration depicting the correlation between the IPD predicted by the true FE model and the IPD predicted by the emulated FE model.
Figure 6:
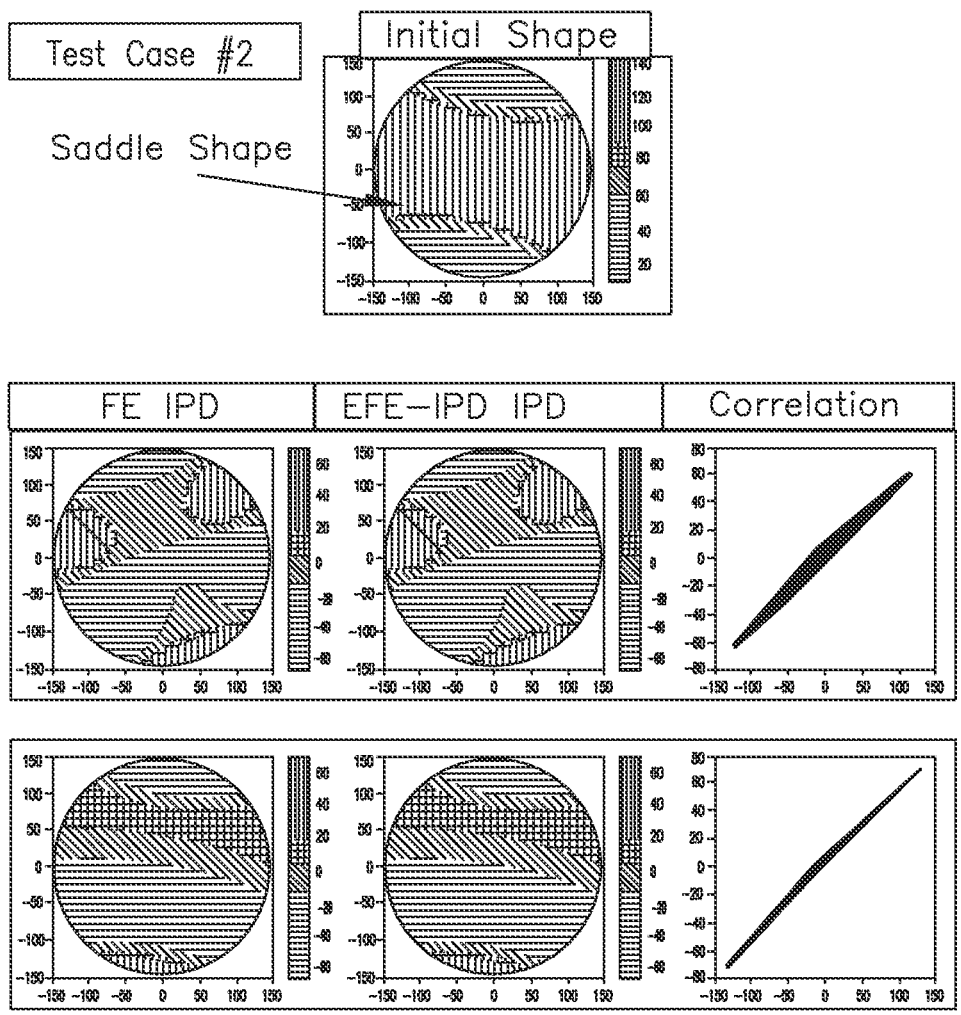
FIG. 6 is an illustration depicting another correlation between the IPD predicted by the true FE model and the IPD predicted by the emulated FE model.

As described above, the emulated FE model based prediction process in accordance with the present disclosure is an analytical/empirical model which is highly efficient compared to FE models. Once the prediction process 200 is completed for the sample wafer shapes created in step 202, the only inputs needed to perform IPD prediction for a new wafer are the initial shape data of that wafer and a set of 120 coefficients (i.e., $c_1$ through $c_{15}$ for calculating each $a_i$, as previously described). Furthermore, testing results indicate that the emulated FE model based prediction process in accordance with the present disclosure provides comparable results against the true FE model based prediction process. For example, both FIGS. 5 and 6 show excellent correlation between the IPD predicted by the true FE model and the IPD predicted by the emulated FE model.

It is contemplated that while the emulated FE model based prediction process described above efficiently addresses the differences between FE model based prediction and HOS based prediction that occur due to the presence of large magnitude $2^{nd}$ order components in the wafer shape, a more generic approach may be utilized to address the FE and HOS IPD differences that are results of not only large magnitude $2^{nd}$ order components but also large magnitude higher-order components of wafer shape. Although the more generic approach may not be as efficient as the emulated FE model based prediction process, it may be suitable to address more general cases and may provide greater prediction accuracies.

As previously mentioned, in semiconductor industry, the finite element (FE) model based prediction process has been widely utilized to analyze the wafer shape change during the chucking process. FE model takes into account of many wafer and system factors of the process, such as the initial wafer shape and wafer material parameters, chuck types and pressure configurations. Once the correct FE model is setup, the accurate prediction of the wafer in-plane-distortion (IPD) and out-plane-distortion (OPD) from the wafer chucking process can be generated from the FE model. However, FE model in general takes long time to run and may not be suitable to the high volume manufacturing application now.

On the other hand, wafer high order shape (HOS) based model has been constructed to provide a more efficient prediction of the wafer IPD and OPD in the chucking process. This model takes the initial wafer shape as input and simulates the wafer chucking process by calculating corresponding wafer shape and shape slopes in various predefined orientations. Then the prediction of the wafer IPD and OPD is calculated. While this model is efficient and can provide good prediction results for the low bow wafer shapes, studies have shown that the accuracy of the prediction degrades as warp increases.

The more generic approach in accordance with the present disclosure is directed to address the differences between the FE model and the HOS model. More specifically, the accuracy and applicability of HOS based IPD and OPD prediction model to a wider range of wafer shapes can be improved by incorporating the analysis results of the FE model responses to the Zernike basis images. These Zernike basis images form a complete set of models that are orthogonal over a circle of unit radius and therefore any wafer shape image can be well approximated by a linear combination of Zernike basis images when enough Zernike basis model images are used.

Figure 7:
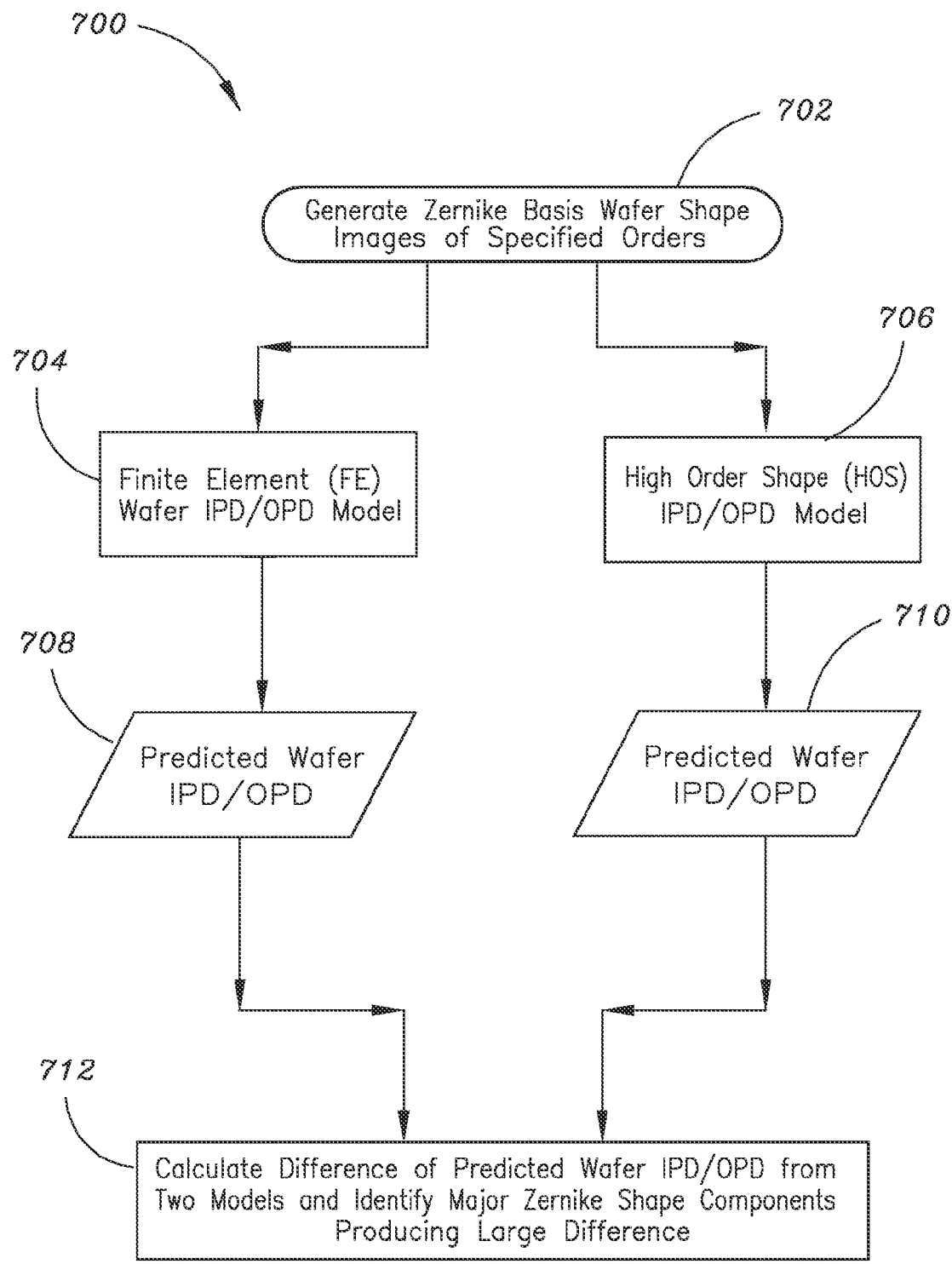
FIG. 7 is a flow diagram illustrating a method for identifying major Zernike shape components that produce large prediction differences between the FE model based IPD prediction and the HOS based IPD prediction.

Referring to FIG. 7, a flow diagram illustrating the analysis stage of the generic approach is shown. Step 702 generates a series of Zernike basis wafer shape images of specified orders. It is understood that the basis images may be generated according to the Zernike polynomials, which are commonly used in interferometric analyses. Since in general IPD/OPD predicted from FE model have non-linear responses to the wafer shape magnitude changes, in the analysis stage, the Zernike basis images with different magnitudes covering the expected wafer shape dynamic range are selected and used as the input images to both FE model and HOS model, as indicated in steps 704 and 706, respectively.

Subsequently, both the FE model and the HOS model proceed to predict wafer IPD/OPD, as indicated in steps 708 and 710, respectively, and the output responses from these two model systems are compared in step 712 to identify major Zernike shape components that produce large differences (e.g., above a certain threshold) between the two model systems. The term and magnitude information of the identified Zernike shapes may be stored (e.g., in a reference database, lookup table or the like) for use in the HOS performance enhancement stage. The image information stored as Zernike terms and coefficients can be efficiently retrieved, allowing the images to be easily reconstructed from the Zernike model information.

Figure 8:
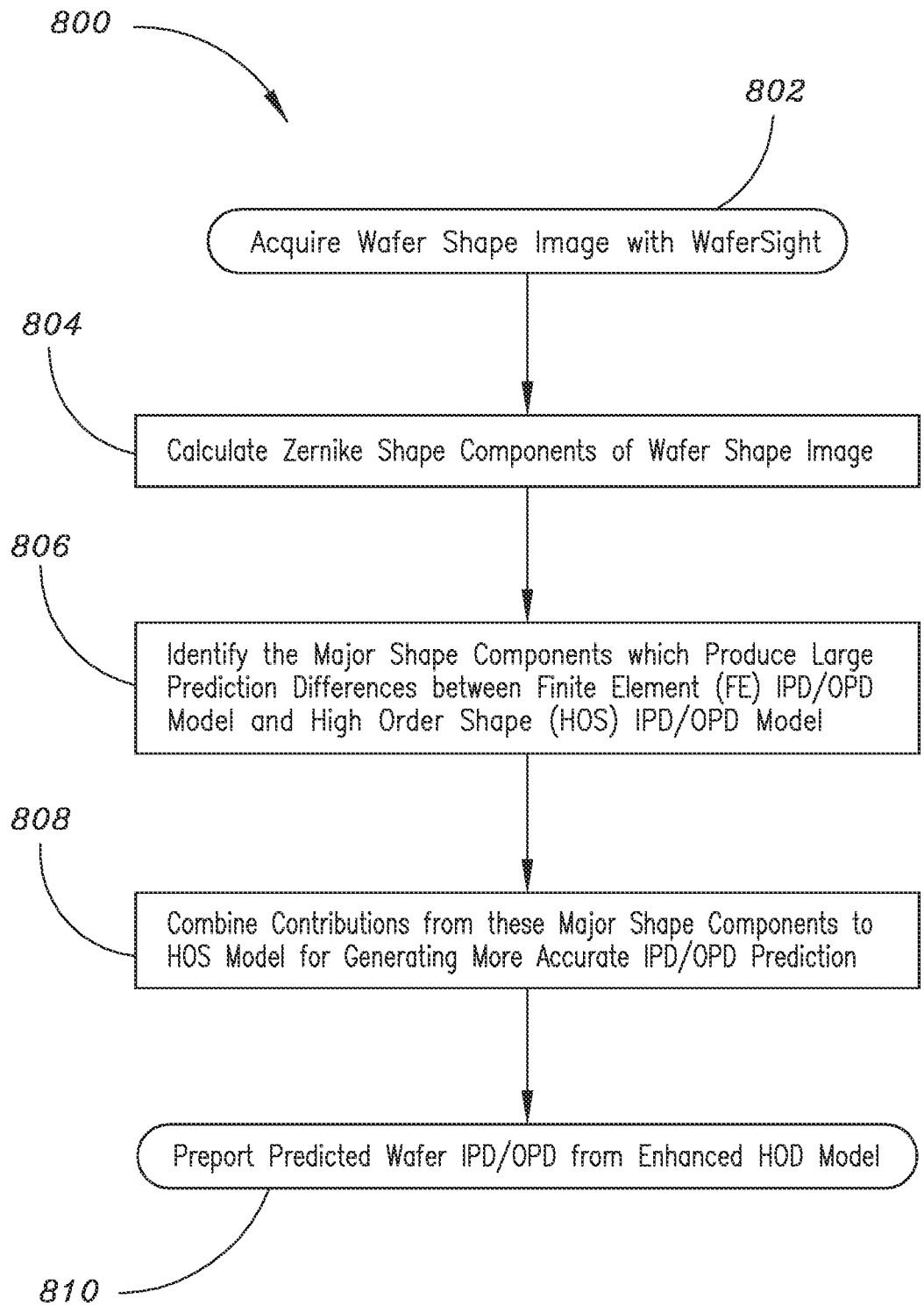
FIG. 8 is a flow diagram illustrating an enhanced HOS based IPD prediction method.

FIG. 8 shows the enhanced HOS IPD/OPD prediction process in accordance with the present disclosure. Step 802 may acquire the wafer shape image using wafer dimensional geometry tools such as the WaferSight metrology system from KLA-Tencor. Step 804 then decompose the wafer shape image to a linear combination of Zernike basis images, which are jointly referred to as Zernike shape components of the wafer shape image. Subsequently, step 806 analyzes each Zernike component and identifies the ones that produce large prediction differences between FE model prediction and HOS model prediction according to the results generated at the analysis stage.

Once the Zernike components that produce large prediction differences are identified, step 808 can retrieve the FE model prediction results for these components and combine the FE model prediction results with the HOS model to produce a more accurate IPD/OPD prediction. That is, since the HOS based IPD/OPD model system is linear, the contributions of the identified major shape components can be combined with the results generated by the HOS IPD/OPD model to produce enhanced IPD/OPD prediction for a wide range of the wafer shape variations. The predicted wafer IPD/OPD from the enhanced HOS model may then be reported in step 810.

It is contemplated that the analysis steps described in FIG. 7 may be performed as a prediction process ahead of time and results saved for future references. In this manner, only the enhanced HOS IPD/OPD prediction process described in FIG. 8 needs to be performed for a given wafer. This approach improves the overall efficiency compared to a complete FE model based process and also improves the prediction accuracy compared to a conventional HOS model based process.

It is also contemplated that the emulated FE model based approach (i.e., using the interim shape) and the generic approach (i.e., using the enhanced HOS prediction) may be used together to further improve the overall IPD prediction. Both approaches for prediction of IPD in accordance with the present disclosure are capable of providing efficient prediction of the wafer IPD in the chucking process, which may be appreciated in various downstream applications such as monitoring and/or controlling overlay errors that occur during semiconductor manufacturing.

Figure 9:
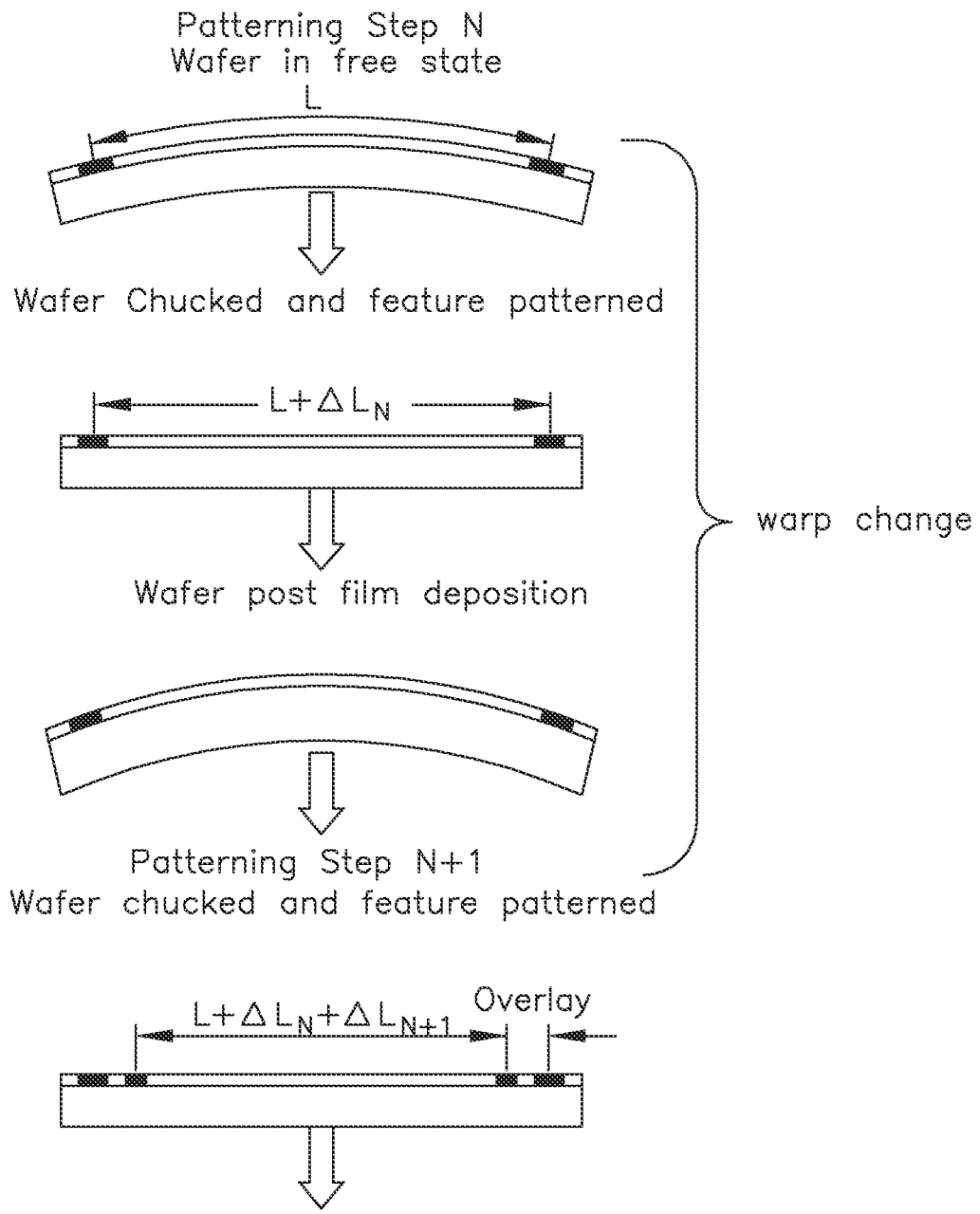
FIG. 9 is an illustration depicting wafer chucking in a lithography scanner.

Overlay error is misalignment between any of the patterns used at different stages of semiconductor integrated circuit manufacture. FIG. 9 is an illustration depicting wafer chucking in a lithography scanner. During patterning a wafer using lithography process, the wafer is held on a vacuum or electrostatic chuck (based on the lithography technology) by using vacuum or electrostatic force respectively. When the wafer is held on a chuck using a force, the shape of the wafer changes compared to the wafer in its free state. The combination of wafer geometry and chucking causes overlay errors between patterning steps N and N+1.

Figure 10:
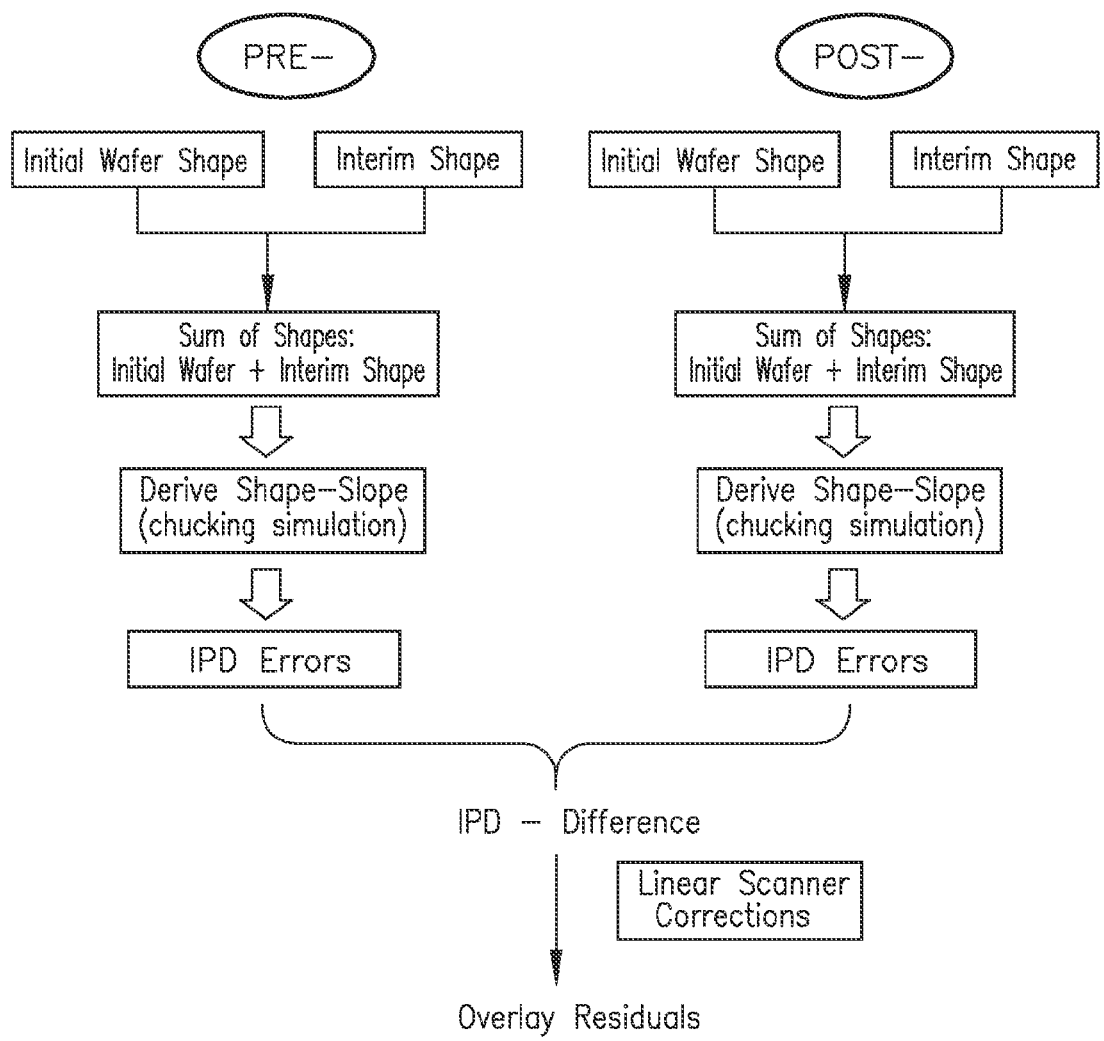
FIG. 10 is a flow diagram illustrating utilizing the IPD prediction results to identify overlay errors due to wafer chucking.

The systems and methods for prediction of IPD due to wafer chucking in accordance with the present disclosure can be utilized to identify overlay errors. For instance, as illustrated in FIG. 10, the emulated FE model based IPD prediction process may be utilized to compute the IPD pre and post the patterning step N+1. That is, prior to performing the patterning step N+1, the shape of the wafer in its free state is measured. The interim shape that corresponds to the measured shape may then be determined and utilized to obtain the predicted IPD as previously described. Similarly, after the patterning step N+1 is completed, the shape of the wafer in its free state is measured again. The interim shape that corresponds to the measured shape after step N+1 may also be determined and utilized to obtain the predicted IPD at the completion of step N+1. The differences between the IPD prior to and after the patterning step N+1 may be obtained subsequently. It is contemplated that any known linear scanner correction routines may be applied to the IPD differences and the end results may be utilized to indicate the overlay errors.

It is contemplated that while the example above referenced the emulated FE model based IPD prediction process, the enhanced HOS prediction process may also be utilized alternatively/additionally without departing from the spirit and scope of the present disclosure. It is also contemplated that the IPD prediction processes in accordance with the present disclosure may be utilized for other applications in addition to overlay error prediction and control described above.

Another critical application of IPD prediction using wafer shape is to feed-forward computed scanner corrections based on predicted IPD to improve the alignment of the wafer on scanner. In this scenario, the wafer shape is measured after step N and the interim shape that corresponds to the measured shape may then be determined and utilized to obtain the predicted IPD as previously described. The wafer shape is then measured right before step N+1 and the interim shape that corresponds to the measured shape may then be determined and utilized to obtain the predicted IPD as previously described. Using these two IPD's scanner corrections needed to align the wafer at N+1 to minimize the misalignment to step N can be computed and feed-forward to the scanner prior to step N+1. Utilizing the feed-forward technique reduces the misalignment and overlay prior to printing litho-layer and eventually reduces wafer re-work.

It is understood that overlay and alignment control and monitoring is one of the many critical applications of the emulated FE metric. The application can also be extended to monitor and control other processes such as Rapid Thermal Processing (RTP), Chemical-Mechanical Planarization (CMP), Chemical Vapor Deposition (CVD) and the like. To enable process control, new prediction process based on the process conditions need to be developed. For example, the chuck design varies from process to process resulting in different wafer chuck interaction that needs to be modeled. One of the key components of localized metric computation is the local area in which the metric is computed. The wafer can be divided into local areas based on the process. For example, in the case of RTP process, RTP chucks have radial zones for heating the wafer, and non-uniform heating can result in wafer geometry variations at different radial bands. Similarly the EFE based IPD metric can be divided into radial bands and appropriate metric computed within the radial band to capture these geometry variations due to non-uniform heating.

Figure 11:
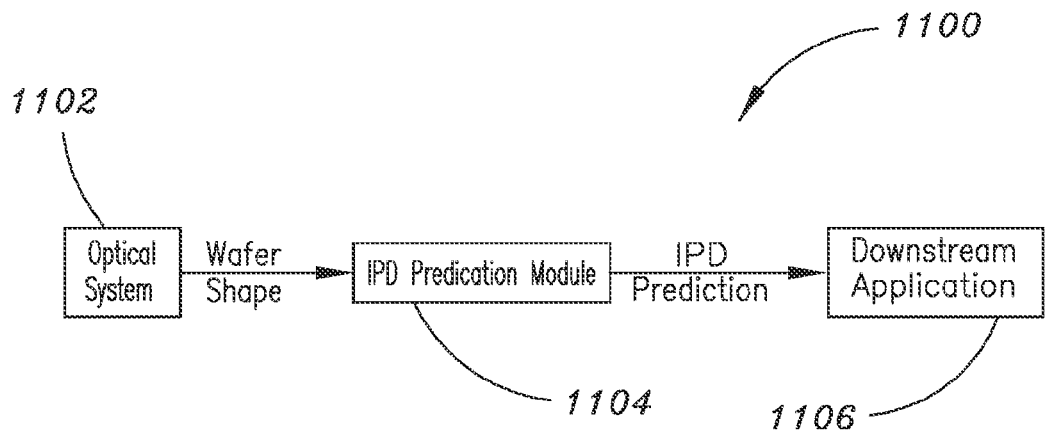
FIG. 11 is a block diagram illustrating a system for providing IPD prediction in accordance with the present disclosure.

Referring now to FIG. 11, a block diagram depicting a system 1100 for providing IPD prediction in accordance with the present disclosure is shown. The IPD prediction system 1100 includes an optical system 1102 configured for obtaining a wafer shape image. As previously described, the optical system 1102 may acquire the wafer shape images directly utilizing wafer dimensional geometry tools such as the WaferSight metrology system from KLA-Tencor. KLA-Tencor WaferSight wafer metrology system measures the wafer front and back surface maps first and then calculates the wafer shape map from them. Alternatively, the wafer shape image, wafer front and back surface shape images or the like may also be constructed indirectly using other metrology tools as well.

The IPD prediction system 1100 also includes an IPD prediction module 1104 in communication with the optical system 1102. The IPD prediction module 1104 is configured for carrying out the methods for providing IPD prediction for a given wafer as described above. The prediction results may subsequently be utilized as control input for various downstream applications 1106, including, but not limited to, overlay error monitor and control, alignment control, as well as RTP, CMP and CVD processes or the like.

Figure 12:
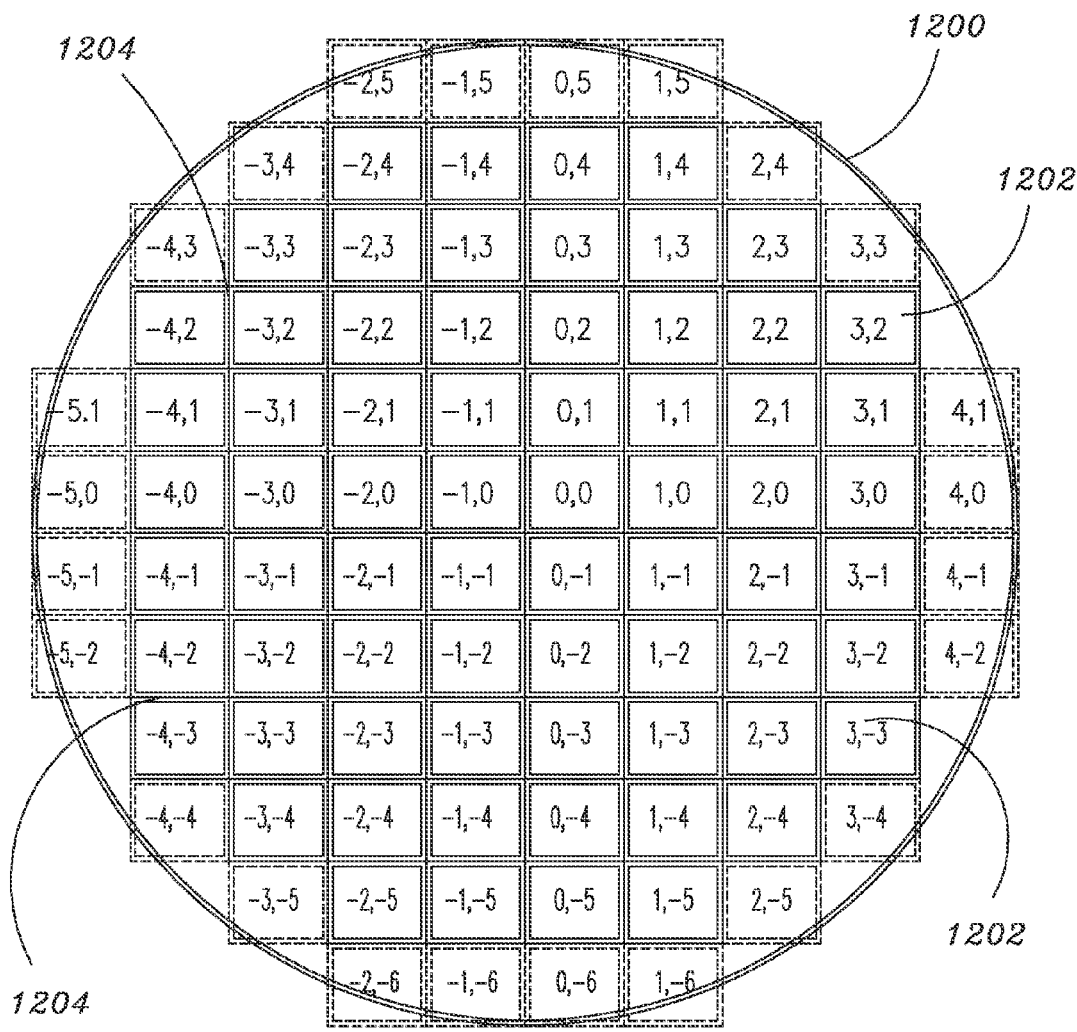
FIG. 12 is an illustration depicting a patterned wafer with streets defined thereof.

It is contemplated that the IPD prediction method and system in accordance with the present disclosure can be used for bare wafers, patterned wafers and the like. Furthermore, the IPD prediction method and system in accordance with the present disclosure can be used for wafers with streets defined thereof. As shown in FIG. 12, non-functional spaces 1204 are defined in between the functional parts (device regions) 1202 defined on a wafer 1200. These non-functional spaces 1204 are commonly referred to as streets.

In one embodiment, the street regions 1204 are masked off when the metrics of the device regions 1202 are calculated for the selected wafer surfaces, including front, back and shape image maps. Unlike the street masking for the patterned wafer inspection where only the scribe streets on the front surface is masked, for the wafer surface metrology measurement using the surface metrology tools, such as KLA-Tencor WaferSight, the scribe streets on the front, back and shape maps of the wafer can be selectively masked. Masking off the street regions 1204 can be done manually or systematically when the patterned wafer geometry measurements are taken. For instance, in manual mode, the user may define the measurement grid size and shift, and the street size for the algorithm to use in the metric calculation. In systematic mode, on the other hand, the grid size and shift, as well as the street positions and widths can be estimated from the pattern wafer image based on the projections and periodic peak identification. As a result, users will not be required to provide these device related values using the systematic mode.

It is understood that while the measurement sites and street size in the exemplary patterned wafer shown in FIG. 12 have uniform distribution, the site size and the street size can also vary cross the wafer surface without departing from the scope and spirit of the present disclosure.

It is contemplated that while the examples above referred to wafer metrology measurements, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A computer implemented method for providing in-plane distortion (IPD) prediction, the method comprising:
    (a) generating a plurality of sample wafer shapes, the plurality of sample wafer shapes generated by varying a set of coefficients B in a predefined shape equation;
    (b) performing finite element (FE) model based IPD prediction for the plurality of sample wafer shapes, wherein IPD predictions with respect to x-axis (X-IPD) and IPD predictions with respect to y-axis (Y-IPD) are obtained for the plurality of sample wafer shapes;
    (c) fitting equations to the FE model based X-IPD predictions and the FE model based Y-IPD predictions for the plurality of sample wafer shapes to obtain a set of coefficients A, wherein the set of coefficients A corresponds to the set of coefficients B of the shape equation used in step (a) to generate the plurality of sample wafer shapes;
    (d) analyzing the set of coefficients B and the set of coefficients A to determine a mapping function $f$ suitable for calculating coefficients A based on coefficients B of the shape equation;
    (e) calculating an interim shape for a given wafer utilizing the mapping function $f$ and a shape equation representing the initial shape of the given wafer; and
    (f) performing IPD prediction for the given wafer based on the interim shape calculated for the given wafer.

2. The method of claim 1, wherein the predefined shape equation for describing a wafer shape $Z_0$ is $Z_0(x,y)=b_1+b_2x^2+b_3xy+b_4y^2, b_i \in B$.

3. The method of claim 2, wherein the equations to be fitted to the X-IPD and Y-IPD predictions include a pair of Taylor polynomials or a pair of Zernike polynomials.

4. The method of claim 2, wherein the X-IPD and Y-IPD predictions are modified by dividing by a neutral surface factor before fitting the equations.

5. The method of claim 4, wherein the equations to be fitted to the modified X-IPD and Y-IPD predictions include:

$$\frac{\partial z}{\partial x} = a_1 2x + a_2 y + a_4 4x^3 + a_5 3x^2 y + a_6 2xy^2 + a_7 y^3$$

for fitting to the FE model based X-IPD prediction; and $$\frac{\partial z}{\partial y} = a_2 x + a_3 2y + a_5 x^3 + a_6 2x^2 y + a_7 3xy^2 + a_8 4y^3$$

for fitting to the FE model based Y-IPD prediction.

6. The method of claim 5, wherein the mapping function $f$ is determined by solving equations:

$$a_i = c_1 b_3 + c_2 b_2^2 + c_3 b_3^2 + c_4 b_4^2 + c_5 b_2 b_4 + c_6 b_2 b_3 + c_7 b_4 b_3 + c_8 b_2^3 + c_9 b_4^3 + c_{10} b_2^2 b_3 + c_{11} b_2^2 b_4 + c_{12} b_3^2 b_2 + c_{13} b_3^2 b_4 + c_{14} b_4^2 b_3 + c_{15} b_4^2 b_2$$

wherein the values of $b_i \in B$ are known for each sample wafer shape, and the values of $a_i \in A$ are determined by fitting the pair of polynomial equations to the modified FE model based X-IPD and Y-IPD predictions for each sample wafer shape.

7. The method of claim 6, wherein calculating the interim shape for the given wafer further comprises:
    calculating the values of coefficients B by fitting the predefined shape equation $Z_0(x,y)=b_1+b_2x^2+b_3xy+b_4y^2$ to the initial shape of the given wafer;
    calculating the values of coefficients A based on the mapping function $f$ and the values of coefficients B; and
    obtaining the interim shape Z as $X(x,y)=a_1x^2+a_2xy+a_3y^2+a_4x^4+a_5x^3y+a_6x^2y^2+a_7xy^3+a_8y^4$, $a_i \in A$.

8. The method of claim 7, wherein predicting the X-IPD and Y-IPD for the given wafer based on the interim shape further comprises:
    calculating a x-slope of the interim shape, $$\frac{\partial z}{\partial x},$$

and the subsequent X-IPD prediction for the given wafer; and calculating a y-slope of the interim shape, $$\frac{\partial z}{\partial y},$$

and the subsequent Y-IPD prediction for the given wafer.

9. The method of claim 1, wherein steps (a) through (d) are a part of a prediction process and are performed prior to and independently from steps (e) and (f).

10. The method of claim 1, further comprising:
(g) obtaining a second shape of the given wafer after a wafer patterning process;
(h) calculating a second interim shape for the second shape of the given wafer utilizing the mapping function $f$;
(i) predicting the X-IPD and Y-IPD for the given wafer after the wafer patterning process based on the second interim shape;
(j) calculating differences between the IPD for the given wafer predicted before the wafer patterning process and the IPD for the given wafer predicted after the wafer patterning process;
(k) applying a linear scanner correction routine to the IPD differences; and
(l) providing overlay error control utilizing the linear scanner corrected IPD differences.

11. The method of claim 1, further comprising:
(g) obtaining a second shape of the given wafer immediately prior to a wafer patterning process;
(h) calculating a second interim shape for the second shape of the given wafer utilizing the mapping function $f$;
(i) predicting the X-IPD and Y-IPD for the given wafer immediately prior to the wafer patterning process based on the second interim shape;
(j) calculating differences between the first predicted IPD for the given wafer and the second predicted IPD;
(k) applying a linear scanner correction routine to the IPD differences; and
(l) feed-forwarding the linear scanner corrected IPD differences to minimize misalignment in the wafer patterning process.

12. The method of claim 1, wherein the predicted IPD for the given wafer is utilized as control input for controlling at least one of: a Rapid Thermal Processing (RTP) process, a Chemical-Mechanical Planarization (CMP) process, or a Chemical Vapor Deposition (CVD) process.

13. The method of claim 1, further comprising:
selectively masking off at least one non-functional space on at least one of: a front, a back and a shape image map of the given wafer.

14. A system for providing in-plane distortion (IPD) prediction for a given wafer, the system comprising:
an optical system configured for obtaining a wafer shape of the given wafer; and
an IPD prediction module in communication with the optical system, the IPD prediction module configured for:
(a) generating a plurality of sample wafer shapes, the plurality of sample wafer shapes generated by varying a set of coefficients B in a predefined shape equation;
(b) performing finite element (FE) model based IPD prediction for the plurality of sample wafer shapes, wherein IPD predictions with respect to x-axis (X-IPD) and IPD predictions with respect to y-axis (Y-IPD) are obtained for the plurality of sample wafer shapes;
(c) fitting equations to the FE model based X-IPD predictions and the FE model based Y-IPD predictions for the plurality of sample wafer shapes to obtain a set of coefficients A, wherein the set of coefficients A corresponds to the set of coefficients B of the shape equation used in step (a) to generate the plurality of sample wafer shapes;
(d) analyzing the set of coefficients B and the set of coefficients A to determine a mapping function $f$ suitable for calculating coefficients A based on coefficients B of the shape equation;
(e) calculating an interim shape for a given wafer utilizing the mapping function $f$ and a shape equation representing the initial shape of the given wafer; and
(f) performing IPD prediction for the given wafer based on the interim shape calculated for the given wafer.

15. The system of claim 14, wherein the predefined shape equation for describing a wafer shape $Z_0$ is $Z_0(x,y)=b_1+b_2x^2+b_3xy+b_4y^2, b_i \in B$.

16. The system of claim 15, wherein the equations to be fitted to the X-IPD and Y-IPD predictions include a pair of Taylor polynomials or a pair of Zernike polynomials.

17. The system of claim 15, wherein the X-IPD and Y-IPD predictions are modified by dividing by a neutral surface factor before fitting the equations.

18. The system of claim 17, wherein the pair of polynomial equations to be fitted to the modified X-IPD and Y-IPD predictions include:

$$\frac{\partial z}{\partial x} = a_1 2x + a_2 y + a_4 4x^3 + a_5 3x^2 y + a_6 2xy^2 + a_7 y^3$$

for fitting to the FE model based X-IPD prediction; and $$\frac{\partial z}{\partial y} = a_2 x + a_3 2y + a_5 x^3 + a_6 2x^2 y + a_7 3xy^2 + a_8 4y^3$$

for fitting to the FE model based Y-IPD prediction.

19. The system of claim 18, wherein the mapping function $f$ is determined by solving equations:

$a_i = c_1 b_3 + c_2 b_2^2 + c_3 b_3^2 + c_4 b_4^2 + c_5 b_2 b_4 + c_6 b_2 b_3 + c_7 b_4 b_3 + c_8 b_2^3 + c_9 b_4^3 + c_{10} b_2^2 b_3 + c_{11} b_2^2 b_4 + c_{12} b_3^2 b_2 + c_{13} b_3^2 b_4 + c_{14} b_4^2 b_3 + c_{15} b_4^2 b_2$ wherein the values of $b_j \in B$ are known for each sample wafer shape, and the values of $a_i \in A$ are determined by fitting the equations to the modified FE model based X-IPD and Y-IPD predictions for each sample wafer shape.

20. The system of claim 19, wherein calculating the interim shape for the given wafer further comprises:
calculating the values of coefficients B by fitting the predefined shape equation $Z_0(x,y)=b_1+b_2x^2+b_3xy+b_4y^2$ to the initial shape of the given wafer;
calculating the values of coefficients A based on the mapping function $f$ and the values of coefficients B; and
obtaining the interim shape Z as $X(x,y)=a_1x^2+a_2xy+a_3y^2+a_4x^4+a_5x^3y+a_6x^2y^2+a_7xy^3+a_8y^4$, $a_i \in A$.

21. The system of claim 20, wherein predicting the X-IPD and Y-IPD for the given wafer based on the interim shape further comprises:
calculating a x-slope of the interim shape, $$\frac{\partial z}{\partial x},$$

and the subsequent X-IPD prediction for the given wafer; and
calculating a y-slope of the interim shape, $$\frac{\partial z}{\partial x},$$

and the subsequent Y-IPD prediction for the given wafer.

22. The system of claim 14, wherein steps (a) through (d) are a part of a prediction process and are performed prior to and independently from steps (e) and (f).

23. The system of claim 14, wherein the IPD prediction module is further configured for:
(g) obtaining a second shape of the given wafer after a wafer patterning process;
(h) calculating a second interim shape for the second shape of the given wafer utilizing the mapping function $f$;
(i) predicting the X-IPD and Y-IPD for the given wafer after the wafer patterning process based on the second interim shape;
(j) calculating differences between the IPD for the given wafer predicted before the wafer patterning process and the IPD for the given wafer predicted after the wafer patterning process;
(k) applying a linear scanner correction routine to the IPD differences; and
(l) providing overlay error control utilizing the linear scanner corrected IPD differences.

24. The system of claim 14, wherein the IPD prediction module is further configured for:
(g) obtaining a second shape of the given wafer immediately prior to a wafer patterning process;
(h) calculating a second interim shape for the second shape of the given wafer utilizing the mapping function $f$;
(i) predicting the X-IPD and Y-IPD for the given wafer immediately prior to the wafer patterning process based on the second interim shape;
(j) calculating differences between the first predicted IPD for the given wafer and the second predicted IPD;
(k) applying a linear scanner correction routine to the IPD differences; and
(l) feed-forwarding the linear scanner corrected IPD differences to minimize misalignment in the wafer patterning process.

25. The system of claim 14, wherein the predicted IPD for the given wafer is utilized as control input to a downstream application, and wherein the downstream application includes at least one of: a Rapid Thermal Processing (RTP) process, a Chemical-Mechanical Planarization (CMP) process, or a Chemical Vapor Deposition (CVD) process.

26. The system of claim 14, wherein the IPD prediction module is further configured for:
selectively masking off at least one non-functional space on at least one of: a front, a back and a shape image map of the given wafer.

27. A computer implemented method for overlay error prediction, the method comprising:
(a) generating a plurality of sample wafer shapes, the plurality of sample wafer shapes generated by varying a set of coefficients B in a predefined shape equation;
(b) performing finite element (FE) model based in-plane distortion (IPD) prediction for the plurality of sample wafer shapes, wherein IPD predictions with respect to x-axis (X-IPD) and IPD predictions with respect to y-axis (Y-IPD) are obtained for the plurality of sample wafer shapes;
(c) fitting equations to the FE model based X-IPD predictions and the FE model based Y-IPD predictions for the plurality of sample wafer shapes to obtain a set of coefficients A, wherein the set of coefficients A corresponds to the set of coefficients B of the shape equation used in step (a) to generate the plurality of sample wafer shapes;
(d) analyzing the set of coefficients B and the set of coefficients A to determine a mapping function $f$ suitable for calculating coefficients A based on coefficients B of the shape equation;
(e) calculating a first interim shape for a given wafer utilizing the mapping function $f$ and a shape equation representing the initial shape of the given wafer;
(f) predicting the IPD for the given wafer based on the first interim shape calculated for the given wafer;
(g) obtaining a second shape of the given wafer after a wafer patterning process;
(h) calculating a second interim shape for the second shape of the given wafer utilizing the mapping function $f$;
(i) predicting the IPD for the given wafer after the wafer patterning process based on the second interim shape;
(j) calculating differences between the IPD for the given wafer predicted before the wafer patterning process and the IPD for the given wafer predicted after the wafer patterning process; and
(k) applying a linear scanner correction routine to the IPD differences to obtain the overlay error prediction.

28. The method of claim 27, wherein the predefined shape equation for describing a wafer shape $Z_0$ is $Z_0(x,y)=b_1+b_2x^2+b_3xy+b_4y^2$, $b_i \in B$.

29. The method of claim 28, wherein the equations to be fitted to the X-IPD and Y-IPD predictions is a pair of Taylor polynomials or a pair of Zernike polynomials.

30. The method of claim 28, wherein the X-IPD and Y-IPD predictions are modified by dividing by a neutral surface factor before fitting the equations.

31. The method of claim 30, wherein the equations to be fitted to the modified X-IPD and Y-IPD predictions include:

$$\frac{\partial z}{\partial x} = a_1 2x + a_2 y + a_4 4x^3 + a_5 3x^2 y + a_6 2xy^2 + a_7 y^3$$

for fitting to the FE model based X-IPD prediction; and $$\frac{\partial z}{\partial y} = a_2 x + a_3 2y + a_5 x^3 + a_6 2x^2 y + a_7 3xy^2 + a_8 4y^3$$

for fitting to the FE model based Y-IPD prediction.

32. The method of claim 31, wherein the mapping function $f$ is determined by solving equations:

$$a_i = c_1 b_3 + c_2 b_2^2 + c_3 b_3^2 + c_4 b_4^2 + c_5 b_2 b_4 + c_6 b_2 b_3 + c_7 b_4 b_3 + c_8 b_2^3 + c_9 b_4^3 + c_{10} b_2^2 b_3 + c_{11} b_2^2 b_4 + c_{12} b_3^2 b_2 + c_{13} b_3^2 b_4 + c_{14} b_4^2 b_3 + c_{15} b_4^2 b_2$$

wherein the values of $b_j \in B$ are known for each sample wafer shape, and the values of $a_i \in A$ are determined by fitting the equations to the modified FE model based X-IPD and Y-IPD predictions for each sample wafer shape.

33. The method of claim 32, wherein calculating the interim shape for the given wafer further comprises:
    calculating the values of coefficients B by fitting the predefined shape equation $Z_0(x,y) = b_1 + b_2 x^2 + b_3 xy + b_4 y^2$ to the initial shape of the given wafer;
    calculating the values of coefficients A based on the mapping function $f$ and the values of coefficients B; and
    obtaining the interim shape Z as $X(x,y) = a_1 x^2 + a_2 xy + a_3 y^2 + a_4 x^4 + a_5 x^3 y + a_6 x^2 y^2 + a_7 xy^3 + a_8 y^4$, $a_i \in A$.

34. The method of claim 33, wherein predicting the X-IPD and Y-IPD for the given wafer based on the interim shape further comprises:
    calculating a x-slope of the interim shape, $$\frac{\partial z}{\partial x},$$

and the subsequent X-IPD prediction for the given wafer; and
    calculating a y-slope of the interim shape, $$\frac{\partial z}{\partial y},$$

and the subsequent Y-IPD prediction for the given wafer.

35. The method of claim 27, wherein steps (a) through (d) are a part of a prediction process and are performed prior to and independently from steps (e) through (k).

36. The method of claim 27, further comprising:
    selectively masking off at least one non-functional space on at least one of: a front, a back and a shape image map of the given wafer.

* * * * *